US010443941B2

(12) United States Patent
Ruf et al.

(10) Patent No.: US 10,443,941 B2
(45) Date of Patent: Oct. 15, 2019

(54) LIGHT ANNEALING IN A COOLING CHAMBER OF A FIRING FURNACE

(71) Applicant: Despatch Industries Limited Partnership, Lakeville, MN (US)

(72) Inventors: Daniel M. Ruf, Minneapolis, MN (US); Brandon Oakes Long, Rosemount, MN (US); Prathna Ung, Rosemount, MN (US); Erik Richard Anderson, Lakeville, MN (US)

(73) Assignee: Illinois Tool Works Inc., Glenview, IL (US)

( * ) Notice: Subject to any disclaimer, the term of this patent is extended or adjusted under 35 U.S.C. 154(b) by 412 days.

(21) Appl. No.: 15/158,358

(22) Filed: May 18, 2016

(65) Prior Publication Data

US 2016/0341479 A1 Nov. 24, 2016

Related U.S. Application Data

(60) Provisional application No. 62/164,235, filed on May 20, 2015.

(51) Int. Cl.
  *F27D 9/00* (2006.01)
  *F27B 9/14* (2006.01)
  (Continued)

(52) U.S. Cl.
  CPC .............. *F27D 9/00* (2013.01); *F27B 9/14* (2013.01); *F27D 11/00* (2013.01);
  (Continued)

(58) Field of Classification Search
  CPC ......... F27D 2009/00; F27D 2009/0021; F27D 2009/0032
  See application file for complete search history.

(56) References Cited

U.S. PATENT DOCUMENTS 6,639,647 B1 * 10/2003 Inou .................... G02F 1/1341
                                                        349/187
9,190,556 B2    11/2015 Wenham et al.
                      (Continued)

FOREIGN PATENT DOCUMENTS

CN    103765143    4/2014
CN    104488094    4/2015
                 (Continued)

OTHER PUBLICATIONS

Int'l Search Report and Written Opinion for PCT/US2016/033293 dated Jul. 28, 2016 (12 pages).

*Primary Examiner* — Steven S Anderson, II
(74) *Attorney, Agent, or Firm* — McAndrews, Held & Malloy, Ltd.

(57) ABSTRACT

One embodiment is directed to an apparatus comprising a firing furnace comprising a heating chamber configured to fire a metallization layer of photovoltaic devices and a cooling chamber configured to cool the photovoltaic devices that have been heated by the heating chamber. The cooling chamber comprises lights to light anneal the photovoltaic devices to reduce light induced degradation as the photovoltaic devices are cooled in the cooling chamber. The cooling chamber of the firing furnace is configured to use residual heat from heating performed in the heating chamber of the firing furnace as heat for the light annealing of the photovoltaic devices. Light annealing is not performed in the heating chamber of the firing furnace.

20 Claims, 3 Drawing Sheets

(51) Int. Cl.
*F27D 11/00* (2006.01)
*H01L 31/18* (2006.01)
*H01L 21/67* (2006.01)
*F27B 9/12* (2006.01)

(52) U.S. Cl.
CPC .. *H01L 21/67098* (2013.01); *H01L 21/67109* (2013.01); *H01L 21/67115* (2013.01); *H01L 21/67173* (2013.01); *H01L 31/1864* (2013.01); F27B 2009/124 (2013.01); Y02E 10/50 (2013.01); Y02P 70/521 (2015.11)

(56) References Cited

U.S. PATENT DOCUMENTS

| | | | |
|---|---|---|---|
| 2010/0040991 A1* | 2/2010 | Chung | F27B 9/20 432/1 |
| 2011/0045628 A1* | 2/2011 | Krebs | C08G 61/126 438/82 |
| 2012/0181265 A1* | 7/2012 | Menard | F27B 9/066 219/388 |
| 2013/0026155 A1 | 1/2013 | Doherty et al. | |
| 2016/0141445 A1* | 5/2016 | Herguth | F27B 9/066 438/98 |

FOREIGN PATENT DOCUMENTS

| | | |
|---|---|---|
| EP | 2958153 A1 | 12/2015 |
| WO | 2012/009636 A1 | 1/2012 |
| WO | 2013/173867 A1 | 11/2013 |
| WO | 2014/206504 A1 | 12/2014 |

\* cited by examiner

LIGHT ANNEALING IN A COOLING CHAMBER OF A FIRING FURNACE

CROSS-REFERENCE TO RELATED APPLICATIONS

This application claims the benefit of U.S. Provisional Patent Application Ser. No. 62/164,235, filed on May 20, 2015, which is hereby incorporated herein by reference.

BACKGROUND

Solar cells are commonly fabricated from p-type crystalline silicon (c-Si) doped with boron. Such solar cells suffer from light-induced degradation (LID) that lowers the efficiency of the solar cells. This is generally ascribed to boron-oxygen (B—O) defects in the silicon.

One approach to reversing such LID involves a post-process step in which finished solar cells are subjected to a low-temperature thermal annealing step in which the solar cells are heated to a temperature between 50° C. to 230° C. while simultaneously generating excess carriers in the silicon. With this approach to reversing LID, excess carriers are generated in the silicon by either applying an external voltage to the solar cells or by subjecting the solar cells to illumination while the solar cells are heated. This LID-reversal approach is described in the patent application WO 2007/107351.

However, this approach for reversing LID is a post-process step, which is performed after fabrication of the solar cell would otherwise be complete. Using such a post-process step adds additional equipment and processing to the fabrication of solar cells. Also, this LID-reversal approach is performed at a low temperature so as to avoid damaging the solar cell that would result from higher-temperature heating.

It has been suggested that a similar approach can be used in the middle of solar cell fabrication during the step of passivation of defects in the silicon by hydrogenation. Using such an approach during hydrogenation passivation is described in the patent application WO 2013/173867. With this approach, the silicon wafer is illuminated during both the heating of the wafer and the subsequent cool down of the wafer during hydrogenation passivation. Such illumination during both heating and subsequent cool down can be performed during any subsequent thermal processes that may degrade the quality of hydrogenation passivation.

However, this approach for protecting the quality of hydrogenation passivation still typically involves illuminating the silicon while the silicon is being heated. Such an approach may not be suitable for use in high-performance, highly efficient solar cell fabrication lines that require precise and stable thermal profiles during metallization firing. Also, such an approach typically involves illuminating the silicon in the presence of a hydrogen source during cooling, which necessitates including a hydrogen source in the cooling chamber.

SUMMARY

One embodiment is directed to an apparatus comprising a firing furnace comprising a heating chamber configured to fire a metallization layer of photovoltaic devices and a cooling chamber configured to cool the photovoltaic devices that have been heated by the heating chamber. The cooling chamber comprises lights to light anneal the photovoltaic devices to reduce light induced degradation as the photovoltaic devices are cooled in the cooling chamber. The cooling chamber of the firing furnace is configured to use residual heat from heating performed in the heating chamber of the firing furnace as heat for the light annealing of the photovoltaic devices. Light annealing is not performed in the heating chamber of the firing furnace.

Another embodiment is directed to a method of co-firing. The method comprises heating photovoltaic devices in a heating chamber of a firing furnace to co-fire metallization layers of the photovoltaic devices. The method further comprises cooling the photovoltaic devices that have been heated by the heating chamber in a cooling chamber of the firing furnace while light annealing the photovoltaic devices to reduce the effects of light-induced degradation using residual heat from heating the photovoltaic devices in the heating chamber as heat for light annealing. Light annealing is not performed in the heating chamber of the firing furnace.

DRAWINGS

DETAILED DESCRIPTION

Figure 1:
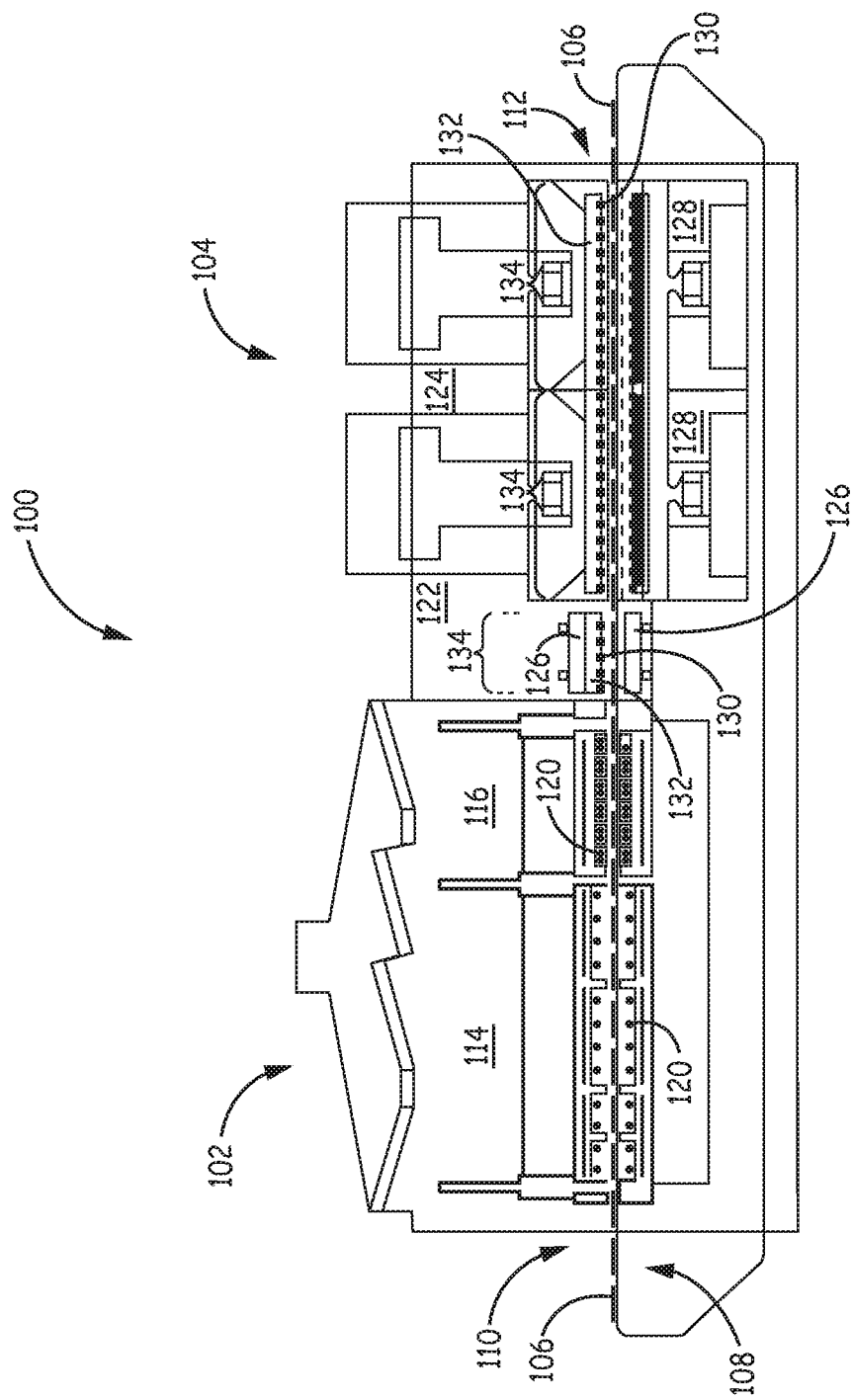
FIG. 1 is a side plan view of one exemplary embodiment of a firing furnace having a heating chamber and a cooling chamber, where light annealing is integrated into the cooling chamber but not the heating chamber.

FIG. 1 is a side plan view of one exemplary embodiment of a firing furnace 100 having a heating chamber 102 and a cooling chamber 104, where light annealing is integrated into the cooling chamber 104 but not the heating chamber 102.

The furnace 100 shown in FIG. 1 is suitable for use in the firing of metal contacts on photovoltaics device (such as solar cells) 106. Wafers of photovoltaic devices (also referred to here as "wafers" or "solar cells") 106 are transported by a conveyor 108 into an entry 110 formed in the firing furnace 100. After processing, the wafers 106 are transported by the conveyor 108 out of an exit 112 formed in the firing furnace 100. More specifically, in the exemplary embodiment shown in FIG. 1, wafers 106 pass through the entry 110 into the heating chamber 102, then pass through the heating chamber 102 and the cooling chamber 104, and then are conveyed out of the furnace 100 through the exit 112.

Although the following description refers to a single conveyor 108 for ease of explanation, it is to be understood that one, two, or more parallel conveyors 108 can be used at the same time in the same furnace 100. Each separate conveyor 108 is also referred to as a "lane." In one implementation, the furnace 100 and the conveyor 108 are configured so that each conveyor 108 (and the solar cells 106 thereon) are thermally isolated from one another in order to reduce lane-to-lane influence.

As noted above, the furnace 100 is used for the firing of metal contacts on photovoltaic devices 106. Front and back side metal contacts of photovoltaic devices 106 are initially formed by an electrically conductive metallized paste or ink that is applied, for example, by a screen printing, inkjet spray or aerosol spray process to silicon wafers. Commonly, the front side contact extends in a grid pattern, and the backside contact extends continuously.

After the metallized paste has been applied to the silicon wafers 106, the wafers 106 are dried. The wafers 106 are dried in order to remove any remaining volatile organic compounds (VOCs) (for example, solvent) used in the screen-printing or other paste-application processes.

In the exemplary embodiment shown in FIG. 1, the solvent removal is decoupled from binder burnout to improve binder retention. This is done by drying the silicon wafers 106 in a heating chamber that is separate from the heating chamber in which the binder burnout is performed. In one example, this is done by using a separate drying furnace (such as a continuous infrared drying furnace) (not shown in FIG. 1) that feeds into the firing furnace 100 shown in FIG. 1. In an alternative embodiment described below in connection with FIG. 3, the drying furnace is integrated with the firing furnace 100.

In the exemplary embodiment shown in FIG. 1, the heating chamber 102 of the firing furnace 100 includes two heating sections 114 and 116. It is to be understood, however, that a different number of heating sections can be used.

In the exemplary embodiment shown in FIG. 1, the first heating section 114 is configured for binder burn out (and is also referred to here as the "binder-burn-out heating section" 114). In this exemplary embodiment, the second heating section 116 is configured for firing the metallization layers of the solar cells 106 (and is also referred to here as the "metallization heating section" 116). In the particular embodiment shown in FIG. 1, the furnace 100 is configured to thermally decouple the binder-burn-out heating section 114 from the metallization heating section 116 so that each section 114 and 116 can be independently controlled and optimized for each of the respective process objectives.

Exhaust ducts are used to thermally decouple each of the heating sections 114 and 116 from each other and from the exterior environment in the case of the binder-burn-out heating section 114 and from the cooling chamber 104 in the case of the metallization heating section 116. The exhaust ducts are also used to vent out of the furnace 100 any off-gases produced while the wafers 106 pass through the furnace 100.

In the exemplary embodiment shown in FIG. 1, each section 114 and 116 includes multiple pairs of infrared (IR) lamps 120, where one "upper" IR lamp 120 of each pair is located above the conveyor 108 and the other "lower" IR lamp 120 of each pair is located below the conveyor 108 directly opposite the corresponding upper IR lamp 120.

In one implementation, the upper and lower IR lamps 120 can be separately controlled in order to provide independent control and optimization of conditions in the top and bottom regions of the heating sections 114 and 116 (for example, because different metal pastes are used on the top and bottom surfaces of the solar cells 106).

In the exemplary embodiment shown in FIG. 1, the heating chamber 102 includes two heating sections 114 and 116, where each of the sections 114 and 116 can be independently controlled (for binder burn out in the case of the section 114 and for firing the metallization layer in the case of section 116). It is to be understood, however, that the heating chamber 102 can be configured to have a different number of sections. Also, one or more of the sections of the heating chamber 102 can be further subdivided into smaller zones or microzones, where each such zone or microzone can be independently controlled to provide additional control over the heating in the heating chamber 102.

In the exemplary embodiment shown in FIG. 1, the cooling chamber 104 of the firing furnace 100 includes two cooling sections 122 and 124. It is to be understood, however, that a different number of cooling sections can be used.

In the exemplary embodiment shown in FIG. 1, the first cooling section 122 uses radiant cooling to cool wafers 106 that pass through the first cooling section 122, and the second cooling section 124 uses convection cooling to cool wafers 106 that pass through the second cooling section 124. The first cooling section 122 is also referred to here as the "radiant" cooling section 122, and the second cooling section 124 is also referred to here as the "convective" cooling section 124.

In the exemplary embodiment shown in FIG. 1, the radiant cooling section 122 includes a pair of cooling walls 126. One of the cooling walls 126 is positioned above the conveyor 108, and the other one of the cooling walls 126 is positioned below the conveyor 108. In the exemplary embodiment shown in FIG. 1, the cooling walls 126 are water-cooled. Cooled water is circulated through pipes (or other passages) that are in thermal contact with the cooling walls 126. It is to be understood, however, that the radiant cooling may be implemented in other ways.

The silicon wafers 106 that exit the heating chamber 102 and pass through the radiant cooling section 122 are cooled by radiant heat transfer from the wafers 106 to the cooling walls 126 and the water flowing through the pipes.

In the exemplary embodiment shown in FIG. 1, the convective cooling section 124 includes two sub-sections 128. Each of the convective cooling sub-sections 128 includes a respective supply fan that draws air from a respective supply duct into the upper part of that cooling sub-section 128 and causes the air to flow down towards the conveyor 108 and to pass the wafers 106. Some of the air contacts the surface of the passing wafers 106 as it flows downward, thereby heating the flowing air. The air then flows below the conveyor 108 and the passing wafers 106. Each convective cooling sub-section 128 also includes a return fan that draws the flowing air into a respective return duct and circulates the air back to one of the supply ducts (via ductwork not shown in FIG. 1) to be re-circulated back into the upper part of the corresponding sub-section 128.

In the embodiment shown in FIG. 1, a respective heat exchanger is positioned in each sub-section 128 below the conveyor 108. Air flowing over and around the passing wafers 106 is heated. Heat from the air flowing past the heat exchanger is transferred to the heat exchanger. This cools the air before it is drawn into the return duct and re-circulated into the upper part of the corresponding sub-section 128.

It is to be understood that the particular embodiment of the heating and cooling chambers 102 and 104 shown in FIG. 1 are merely exemplary. The heating and cooling chambers 102 and 104 can be implemented in other ways.

One or more sections 122 and 124 of the cooling chamber 104 include lights 130 for performing light annealing of the solar cell wafers 106 passing through the cooling chamber 104.

The purpose of light annealing is to reduce the effect of light induced degradation (LID) that occurs in the solar cells 106. Traditionally, this light anneal has involved exposing completed solar cells to intense light at an elevated temperature in a separate, standalone process where the intense illumination occurs, at least in part, in a heating chamber of a furnace.

However, with the co-firing furnace 100 described here in connection with FIG. 1, light annealing to reduce the effects of LID is integrated into the cooling chamber 104 of the co-firing furnace 100. Light annealing is not performed in the heating chamber 102 of the co-firing furnace 100. Instead, residual heat from the heating chamber 102 is used to achieve the required elevated temperature for light annealing in the cooling sections 122 and 124 of the cooling chamber 104. Also, in this exemplary embodiment, a hydrogen source is not present in the cooling chamber 104; instead, light annealing is performed in ambient air.

In the exemplary embodiment shown in FIG. 1, an array of lights 130 is positioned in both the radiant cooling section 122 and the convective cooling section 124 of the cooling chamber 104 but not in the heating chamber 102.

In the exemplary embodiment shown in FIG. 1, for each of the cooling sections 122 and 124, the lights 130 comprise light emitting diodes (LEDs) that are mounted on a water-cooled plate 132. Cooled water is circulated through pipes (or other passages) that are in thermal contact with the plate 132. The plate 132 is water cooled in order to remove heat generated by the LEDs 130 and any heat that is transferred to the LEDs 130 and plates 132 by the passing solar cells 106.

In the exemplary embodiment shown in FIG. 1, one plate 132 with LEDs 130 mounted to it is positioned within the radiant cooling section 122, and another plate 132 with LEDs 130 mounted to it is positioned with the convective cooling section 124. However, it is to be understood multiple plates 132 with LEDs 130 mounted to them can be positioned within the radiant cooling section 122 or the convective cooling section 124. Also, a single plate 132 with LEDs 130 mounted to it can be used in both the radiant cooling section 122 and the convective cooling section 124. That is, the single plate 132 with LEDs 130 mounted to it can span the radiant cooling section 122 and the convective cooling section 124.

In the radiant cooling section 122, the respective water-cooled plate 132 (with the LEDs 130 mounted to it) is positioned between the upper cooling wall 126 and the conveyor 108 with the light output from the LEDs 130 directed generally downward towards the upper surface of the solar cells 106 passing by on the conveyor 108.

In the convective cooling section 124, the respective water-cooled plate 132 (with the LEDs 130 mounted to it) is positioned in the upper part of the section 124 above the conveyor 108 with the light output from the LEDs 130 directed generally downward towards the upper surface of the solar cells 106 passing by on the conveyor 108. The portion of the water-cooled plate 132 that is positioned in the convective cooling section 124 has a shape (and/or openings formed it) to enable air flowing through the convective cooling section 124 to pass through and/or around the water-cooled plate 132 and the mounted LEDs 130.

The water-cooled plate 132 can be mounted within the cooling sections 122 and 124 in any suitable manner (for example by attaching, suspending, or supporting the plate 132 and LEDs 130 to one or more of the side, top, or bottom walls of the furnace 100 or one or more structures within the cooling chamber 104 such as the cooling walls 126).

A power supply (not shown) is electrically connected to each of the LEDs 130 in order to provide power to the LEDs 130. In this exemplary embodiment, the power supply is positioned outside of the cooling chamber 104.

The number, size, and arrangement of the LEDs 130 in the array are configured so as to provide sufficiently intense illumination for performing light annealing to reduce LID (for example, by having a radiation intensity in a range between 3,000 Watts/meters$^2$ and 48,000 Watts/meters$^2$). For example, in one implementation, 10 millimeter by 10 millimeter LEDs are arranged in an array in which there are at least two thousand LEDs in an area that is about 0.3 meters wide by about 3 meters long. It is to be understood, however, that the LEDs can be arranged in other ways.

In this exemplary embodiment, the LEDs 130 are commercially available LEDs that output light in the spectrum between 300 nanometers and 900 nanometers (that is, within the visible spectrum).

Moreover, one advantage of using LEDs 130 to provide the intense light for light annealing is that the intensity of light output from the LEDs 130 can be adjusted by adjusting the DC voltage supplied to the LEDs 130. This enables the light intensity to be adjusted as needed to optimize the light annealing process.

In the exemplary embodiment shown in FIG. 1, the array of LEDs 130 includes multiple zones 134, where each zone 134 includes a subset of the LEDs 130. In this exemplary embodiment, the intensity of light output by the LEDs 130 in each of the zones 134 can be independently controlled. The zones 134 can be adjusted so that the intensity of light output by the LEDs 130 in at least one of the zones 134 differs from the intensity of light output by the LEDs 130 in at least one of the other zones 134. For example, the temperature of the solar cells 106 will be reduced as the solar cells 106 are conveyed through the cooling chamber 104. As a result, it might be beneficial to adjust the light intensity in the various zones 134 to account for this reduction in temperature as the solar cells are conveyed through the cooling chamber 104.

In general, the process of light annealing for LID reduction can be controlled based on various factors including, without limitation, the speed at which the solar cells 106 are conveyed through the cooling chamber 104, the length of the cooling chamber 104, the length of the array of LEDs 130, the exit temperature of the solar cells 106 as they exit the heating chamber 102 and enter the cooling chamber 104, the intensity of light output from the LEDs 130 in each of the light zones 134 (or the array of LEDs 130 as a whole where zones 134 are not used), and the number, size, and arrangement of the LEDs 130.

In one implementation, one or more of these factors are controlled so that each solar cell 106 moving through the cooling sections 122 and 124 on the conveyor 108 will be exposed to the intense light from the LEDs 130 for an amount of time between 5 seconds and 45 seconds. In one example, this is done while each solar cell 106 is at a temperature between 700° C. and 240° C. In another example, this is done while each solar cell 106 is at a temperature between 700° C. and 50° C.

Figure 2:
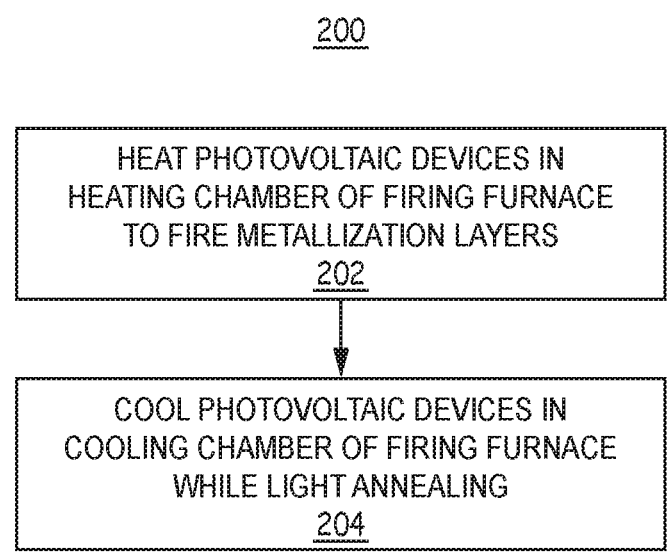
FIG. 2 is a flow diagram of one exemplary embodiment of a method of co-firing the metallization layers of solar cells or other photovoltaic devices.

FIG. 2 is a flow diagram of one exemplary embodiment of a method 200 of co-firing the metallization layers of solar cells or other photovoltaic devices. The exemplary embodiment of method 200 is described here as being implemented using the co-firing furnace 100 of FIG. 1 (though it is to be understood that it can be implemented in other ways, for example, using the combined apparatus described below in connection with FIG. 3).

Method 200 comprises heating solar cells 106 (or other photovoltaic devices) in a heating chamber 102 of a furnace 100 to co-fire the metallization layers of the solar cells 106 (block 202). The solar cells 106 are not light annealed as they pass through the heating chamber 102 of the furnace 100. In the exemplary embodiment described here in connection with FIG. 2, the solar cells 106 are first heated in a binder-burn-out section 114 to burn out the binders in the metallization pastes and then are heated in a metallization section 116 in order to co-fire the metallization layers of the solar cells 106. In this exemplary embodiment, the heating chamber 102 is configured to efficiently provide flexible and precise process control in a high-volume production environment.

Method 200 further comprises cooling the heated solar cells 106 (or other photovoltaic devices) in a cooling chamber 104 of the furnace 100 while light annealing the solar cells 106 (or other photovoltaic devices) to reduce the effects of light-induced degradation (block 204). In the exemplary embodiment described here in connection with FIG. 2, the heated solar cells 106 are first radiantly cooled in the radiant cooling section 122 of the cooling chamber 104 and then are convectively cooled in the convective cooling section 124 of the cooling chamber 104. In this exemplary embodiment, light annealing is performed by the LEDs 130 positioned in the cooling chamber 104 while the heated solar cells 106 are cooled in both the radiant cooling section 122 and the convective cooling section 124 of the cooling chamber 104. Also, in this exemplary embodiment, a hydrogen source is not present in the cooling chamber 104; instead, light annealing is performed in ambient air.

In this exemplary embodiment where the array of LEDs 130 includes multiple zones 134, the intensity of light output by the LEDs 130 in each of the zones 134 can be independently controlled and adjusted (for example, to adjust the light intensity in the various zones 134 to account for the reduction in temperature as the solar cells 106 are conveyed through the cooling chamber 104).

By incorporating light annealing to reduce the effects of LID into the cooling chamber 104 of the co-firing furnace 100, a separate, standalone light annealing process step can be avoided, which avoids adding additional equipment and processing to the fabrication of solar cells. Also, by not performing light annealing in the heating chamber 102 of the co-firing furnace 100, lights for providing the intense light for light annealing do not need to be placed in the heating sections 114 and 116 of the co-firing furnace 100. Placing lights for light annealing in the heating sections 114 and 116 could impair the ability to provide flexible and precise process control, especially where one or more of the heating sections 114 and 116 is further sub-divided into high-resolution microzones that are independently controlled since it may be difficult to accommodate both the heating-related equipment for providing the desired thermal properties and the lights for light annealing in such zones and microzones. Also, it is easier to assemble and maintain a co-firing furnace 100 with lights 130 for light annealing integrated in only the cooling chamber 104. Moreover, the light annealing techniques described here are especially well suited for use in co-firing furnaces 100 that are configured for use in high-volume production environments. Also, the light annealing techniques described here do not require a hydrogen source to be present in the cooling chamber 104; instead, light annealing can be performed in ambient air.

In the embodiments described above in connection with FIGS. 1 and 2, the solar cells 106 are dried in a separate drying furnace that is not shown in FIG. 1. However, it is to be understood that the light annealing techniques described above can be used in combined drier/co-firing furnaces.

Figure 3:
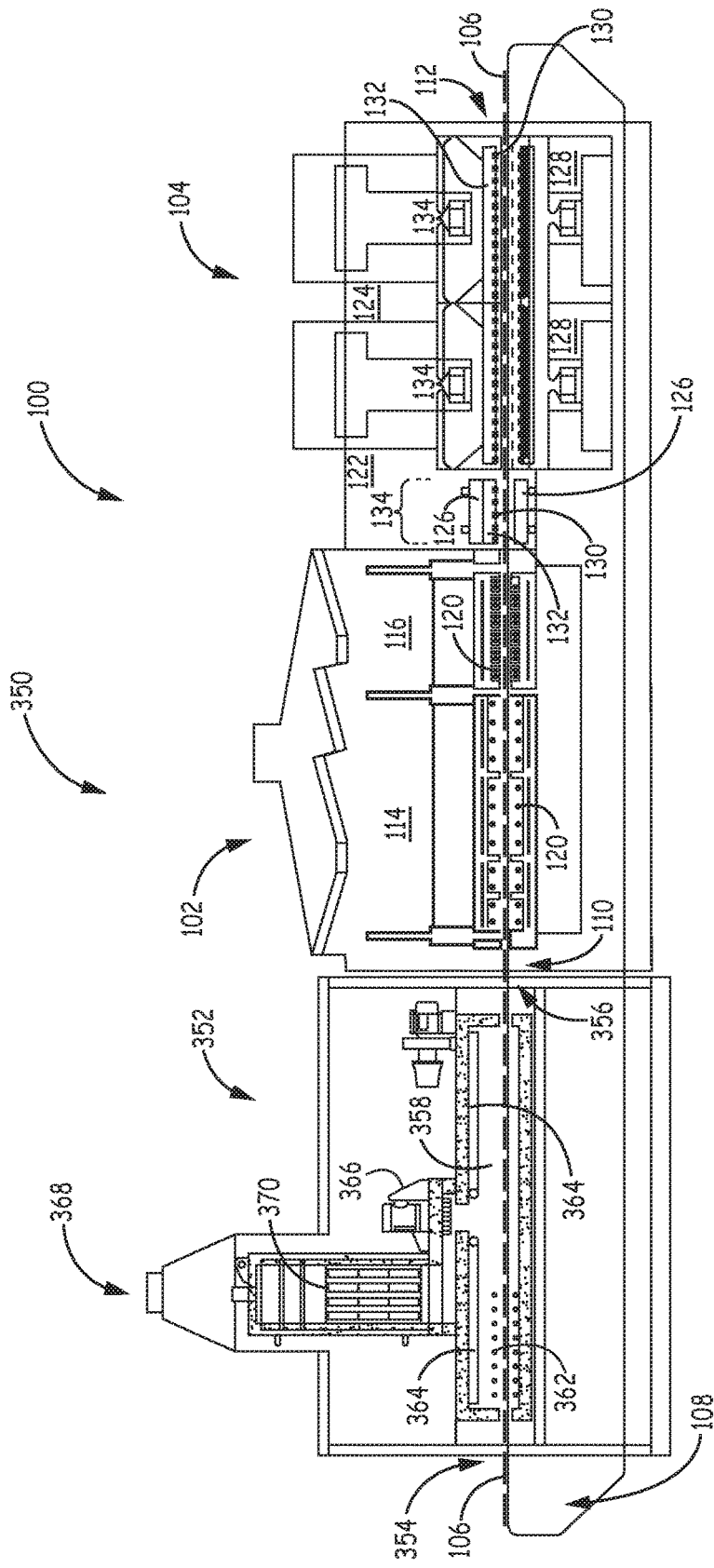
FIG. 3 is a side plan view of one exemplary embodiment of a combined apparatus in which a drying furnace is integrated with a firing furnace having a heating chamber and a cooling chamber, where light annealing is integrated into the cooling chamber but not into the heating chamber.

FIG. 3 is a side plan view of one exemplary embodiment of a combined apparatus 350 in which a drying furnace 352 is integrated with a firing furnace 100 having a heating chamber 102 and a cooling chamber 104, where light annealing is integrated into the cooling chamber 104 but not into the heating chamber 102.

In general, the firing furnace 100 is as described above in connection FIGS. 1 and 2, the description of which is not repeated here in connection with FIG. 3.

In the exemplary embodiment shown in FIG. 3, the drying furnace 352 is integrated with the firing furnace 100.

After metallized paste has been applied to the silicon wafers 106, the wafers 106 are transported by a conveyor 108 into an entry 354 formed in the drying furnace 352. After processing, the wafers are transported by the conveyor 108 out of an exit 356 formed in the drying furnace 352. The drying furnace 352 includes a heating chamber 358 in order to dry the solar cells 106 in order to remove any remaining volatile organic compounds (VOCs) (for example, solvent) used in the screen-printing or other paste-application processes. More specifically, in the exemplary embodiment shown in FIG. 3, wafers 106 pass through the entry 354 into the heating chamber 358 of the drying furnace 352, then pass through the heating chamber 358 to dry the solar cells 106 to remove any VOCs, and then are conveyed out of the drying furnace 352 through the exit 356.

In the exemplary embodiment shown in FIG. 3, the heating chamber 358 of the drying furnace 352 includes one or more infrared (IR) lamps 362 located in a region close to the entry 354. In this exemplary embodiment, IR lamps 362 are located above and below the conveyor 108 so as to direct infrared light toward the top and bottom surfaces of the solar cells 106.

Also, in the exemplary embodiment shown in FIG. 3, supply ducts 364 are positioned above the conveyor 108 in the regions near the entry 354 and exit 356. Each supply duct 364 includes a respective inlet at the end of the duct 364 nearest the center of the heating chamber 358. Heated air is supplied to the supply ducts 364 at the respective inlets and flows towards the other end of the supply ducts 364. Each of the supply ducts 364 includes a plurality of openings on its bottom wall. A portion of the heated air that flows along each supply duct 364 will flow out of the openings towards the conveyor 108 and any solar cells 106 passing under the supply duct 364. Heated air is supplied to the supply ducts 364 by a supply fan, one or more heaters, and appropriate ductwork (all of which are not shown in FIG. 3).

Heat from the IR lamps 362 and/or the heated air discharged from the openings of the supply ducts 364 heats the solar cells 106 passing by on the conveyor 108 in order to vaporize one or more compounds (such as solvent) used in the metallized pastes.

In the exemplary embodiment shown in FIG. 3, an exhaust port is positioned generally in the center of the heating chamber 358. An exhaust blower 366 draws airs from the interior of the heating chamber 358 through the exhaust port and into an exhaust stack 368. In this exemplary embodiment, a thermal VOC oxidizer 370 is positioned in the exhaust stack 368 in order to thermally oxidize VOCs from the air stream flowing into the exhaust stack 368 before the air exits the drying furnace 352.

It is noted that light annealing is not performed in the drying furnace 352.

In the exemplary embodiment shown in FIG. 3, solvent removal is decoupled from binder burnout to improve binder retention. This is done by drying the silicon wafers 106 in the heating chamber 358 of the drying furnace 352, which is separate and decoupled from the binder-burn-out section 114 of the heating chamber 102 of the co-firing furnace 100. After the solar cells 106 are dried in the drying furnace, they are conveyed into the entry 110 of the co-firing furnace 100 for firing, where light annealing to reduce the effects of LID is performed in the cooling chamber 104 but not in the heating chamber 102.

After exiting the drying furnace 352, the dried solar cells 106 are conveyed into the heating chamber 102 of the firing furnace 100 for binder burn out and firing of the metallization layers of the solar cells 106. After that, the solar cells 106 are conveyed into the cooling chamber 104 to be cooled. While the solar cells 106 are being cooled, the solar cells 106 are light annealed by exposing the solar cells 106 to intense illumination from the LEDs 130. This is all done as described above in connection with FIGS. 1 and 2.

A number of embodiments have been described. Nevertheless, it will be understood that various modifications to the described embodiments may be made without departing from the spirit and scope of the claimed invention.

What is claimed is:

1. An apparatus comprising:
a firing furnace comprising: a heating chamber configured to fire a metallization layer of photovoltaic devices and a cooling chamber configured to cool the photovoltaic devices that have been heated by the heating chamber;
wherein the cooling chamber comprises light emitting diodes (LEDs) configured to light anneal the photovoltaic devices to reduce light induced degradation as the photovoltaic devices are cooled in the cooling chamber, wherein the LEDs comprise a plurality of zones within the cooling chamber, each zone comprising a subset of the LEDs, wherein an intensity of light output by the LEDs of each of the zones differs from an intensity of light output by the LEDs of at least one of the other zones; and
wherein the cooling chamber of the firing furnace is configured to use residual heat from heating performed in the heating chamber of the firing furnace as heat for the light annealing of the photovoltaic devices; and
wherein light annealing is not performed in the heating chamber of the firing furnace.

2. The apparatus of claim 1, wherein the cooling chamber of the firing furnace is configured to light anneal the photovoltaic devices for between 5 seconds and 45 seconds.

3. The apparatus of claim 1, wherein the cooling chamber of the firing furnace is configured to light anneal the photovoltaic devices while each of the photovoltaic devices is at a temperature between 700° C. and 240° C.

4. The apparatus of claim 1, wherein the LEDs comprise a plurality of zones within the cooling chamber, each zone comprising a subset of the LEDs, wherein an intensity of light output by the LEDs of each of the zones differs from an intensity of light output by the LEDs of at least one of the other zones.

5. The apparatus of claim 1, wherein an intensity of light output by the light emitting diodes is adjustable.

6. The apparatus of claim 1, wherein an intensity of light output by the LEDs to light anneal is in a range of between 3,000 Watts/meters$^2$ and 48,000 Watts/meter$^2$.

7. The apparatus of claim 1, wherein the LEDs emit light in the visible spectrum.

8. The apparatus of claim 1, wherein the LEDs emit light having a wavelength between about 300 nanometers and about 900 nanometers.

9. The apparatus of claim 1, wherein the LEDs are mounted to a water-cooled plate.

10. The apparatus of claim 9, wherein the water-cooled plate is configured to enable air to pass around or through the water-cooled plate.

11. The apparatus of claim 1, wherein the cooling chamber comprises first and second cooling sections, wherein the first section is configured to radiantly cool the photovoltaic devices and the second section is configured to convectively cool the photovoltaic devices.

12. The apparatus of claim 1, wherein the heating chamber comprises a first and second heating sections, wherein the first heating section is configured to burn out a binder used in the metallization layer of the photovoltaic devices and the second heating section is configured to fire the metallization layer of the photovoltaic devices.

13. The apparatus of claim 1, further comprising a drying furnace configured to dry the metallization layers of the photovoltaic devices prior to being conveyed to the firing furnace.

14. The apparatus of claim 1, wherein the cooling chamber is configured to light anneal the photovoltaic devices in ambient air.

15. The apparatus of claim 1, wherein the cooling chamber comprises a first cooling section configured to cool the photovoltaic devices via radiant cooling and a second cooling section configured to cool the photovoltaic devices via convection cooling.

16. The apparatus of claim 15, wherein the LEDs are positioned in at least one of the first cooling section or the second cooling section.

17. A method of co-firing comprising:
heating photovoltaic devices in a heating chamber of a firing furnace to co-fire metallization layers of the photovoltaic devices; and
cooling the photovoltaic devices that have been heated by the heating chamber in a cooling chamber of the firing furnace, while light annealing the photovoltaic devices in the cooling chamber, using light emitting diodes (LEDs) located in the cooling chamber, to reduce the effects of light-induced degradation using residual heat from heating the photovoltaic devices in the heating chamber as heat for light annealing, wherein the LEDs comprise a plurality of zones within the cooling chamber, each zone comprising a subset of the LEDs, wherein an intensity of light output by the LEDs of each of the zones differs from an intensity of light output by the LEDs of at least one of the other zones; and
wherein light annealing is not performed in the heating chamber of the firing furnace.

18. The method of claim 17, wherein the cooling chamber of the firing furnace is configured to light anneal the photovoltaic devices for between 5 seconds and 45 seconds.

19. The method of claim 17, wherein light annealing the photovoltaic devices to reduce the effects of light-induced degradation comprises light annealing the photovoltaic devices to reduce the effects of light-induced degradation while the photovoltaic devices are at a temperature between 700° C. and 240° C.

20. The method of claim 17, wherein light annealing the photovoltaic devices to reduce the effects of light-induced degradation comprises light annealing the photovoltaic devices to reduce the effects of light-induced degradation using light emitting diodes positioned within the cooling chamber of the firing furnace.

* * * * *